United States Patent [19]

Roberts

[11] 4,419,146
[45] Dec. 6, 1983

[54] SOLDER FLUX COMPOSITIONS

[75] Inventor: Daniel F. T. Roberts, Walden, England

[73] Assignee: International Standard Electric Corporation, New York, N.Y.

[21] Appl. No.: 283,409

[22] Filed: Jul. 15, 1981

[51] Int. Cl.³ .............................................. B23K 35/36
[52] U.S. Cl. ....................................... 148/23; 148/24; 148/25
[58] Field of Search ................................... 148/23–25; 427/96

[56] References Cited

U.S. PATENT DOCUMENTS 3,459,606  8/1969  Becker .................................. 148/23
3,575,738  4/1971  Becker .................................. 148/23

Primary Examiner—P. D. Rosenberg
Attorney, Agent, or Firm—John T. O'Halloran

[57] ABSTRACT

Solder flux compositions are prepared by forming a dispersion of a flux material in a liquid in which the flux is substantially insoluble. The composition may be applied to a workpiece by brushing, spraying, or as an unstable foam. A method of tinning circuit boards using such flux compositions is also described.

9 Claims, 1 Drawing Figure

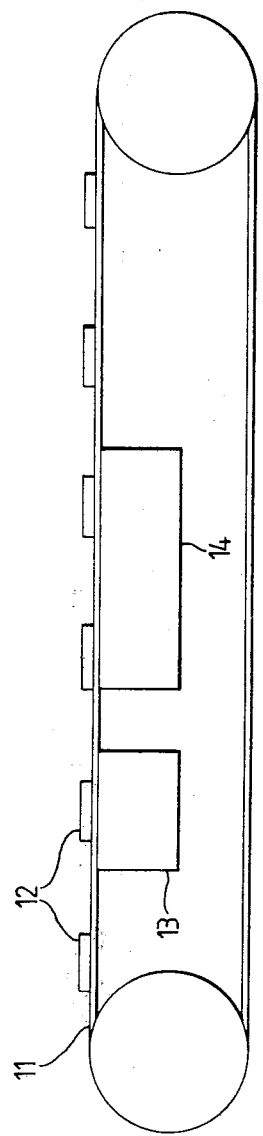

SOLDER FLUX COMPOSITIONS

This invention relates to solder flux compositions and to methods of fluxing and tinning or solderbonding components to printed circuit boards using such compositions.

Printed circuit boards are normally tinned with a solder composition prior to assembly of electrical circuits thereon. To effect tinning it is economic to employ some form of flux and, in a typical industrial process, this flux is dissolved in a solvent liquid which is then applied to the board as a foam, or applied by spraying or brushing or combinations of these methods. For manual soldering a similar liquid flux may be used. Various solvents are employed, but organic solvent based fluxes are preferred as most organic solvents remove or disperse residual plasticisers and lacquer from the board surface and thus ensure efficient tinning. The method of flux formulation herein described can be used for water based fluxes if required. However the range of flux materials that can be employed is at present limited to those that are soluble in a relatively cheap and non-hazardous organic solvent, such as alcohols. Furthermore, some of the flux materials at present employed leave harmful flux residues or the board, these residues subsequently giving rise to corrosion. This then necessitates thorough washing of a fluxed and tinned board thus increasing the production costs. However, subsequent inspection operations may make removal of flux residues essential.

It is more economic to solder the assembly together without pre-tinning the printed circuit board. This is a method which is now coming into use. It is of advantage in this case to employ similar fluxes but it is often desirable to employ fluxing materials, whether subsequent removal of the residues be considered necessary or unnecessary, which will flux metallic materials employed in electronic components such as nickel alloys or copper alloys as well as tinned or bare copper. This requirement limits the composition of fluxing compounds or mixtures of compounds available as such compositions must be all substantially soluble in the solvent.

The object of the invention is to minimise or to overcome these disadvantages.

According to one aspect of the invention there is provided a flux composition comprising a liquid or solid flux dispersed in the form of an emulsion or a suspension in a liquid in which the flux material is substantially insoluble. This includes insufficient solubility, and need not imply mutual insolubility which is a special case of this technique. In this context fluxing "activators" are considered as fluxing materials as in many cases these added materials ensure adequate solderbonding.

According to another aspect of the invention there is provided a method of tinning or solderbonding a printed circuit board with or without inserted components with a solder composition, the method including forming a dispersion of a flux composition in a liquid in which the flux is substantially insoluble, applying the dispersion to a printed circuit board, and applying a molten solder composition to the board to effect tinning or solderbonding.

The term "dispersion" as employed herein is understood to include both solid and liquid materials in a finely divided form. Therefore it includes flux compositions which may be a solid of low melting point related to room temperature, and flux compositions in which the solvent has inadequate solvent capacity for the flux component rather than effectively nil solubility.

Embodiments of the invention will now be described with reference to the accompanying drawing in which the single FIGURE is a schematic diagram of a circuit board fluxing and tinning arrangement.

Referring to the drawing, the arrangement includes a conveyor 11 on which circuit boards 12 are carried and which carries each board over a fluxing station 13 and a tinning station 14. As each board passes over the fluxing station the flux dispersed in a liquid is applied to the underside of the board 12 as a foam, spray, or applied with a brush supplied with the liquid flux-solvent mixture. To ensure that an unstable foam is obtained a small quantity of one or more wetting agents may be added to the flux, this technique being well known to those skilled in the art. The fluxed board is then carried to the tinning station 14 where molten solder is applied to the board e.g. a mechanised soldering arrangement. The tinned boards are then allowed to cool and, in some applications, washed to remove any flux residues. The fluxes herein described are not in any way limited to mechanised soldering and may be used for manual soldering if necessary.

The flux compositions employed in the process described above are prepared by forming a dispersion of a flux in a liquid in which the flux is substantially insoluble. Where the flux is a solid material it may be micronised, e.g. in a fine grinding mill, the finely divided material then being dispersed in a liquid, or a liquid flow mill. Liquid fluxing materials may also be employed, the flux being dispersed in a non-solvent liquid by a liquid flow type mill. The flux dispersion so formed may be applied to a workpiece by brushing, spraying, dip coating or by foam coating. The latter method is preferred in continuous production processes and for this purpose the flux dispersion may contain a small quantity of a wetting agent. The concentration of the wetting agent in the flux composition should be such that the material forms an unstable foam when subjected to air blowing to form small bubbles.

Micronisation may be achieved using a wide range of available equipment designed for this purpose. As the desired product is a solid or a liquid dispersed in a less viscous liquid, the type of equipment used may be either that designed to mill or grind solids without a liquid carrier to very fine grain size, or the type requiring a liquid throughput. In this second type the breakdown of the solid particles to a smaller grain size is achieved by violent shear (turbulence) of the liquid itself rather than comminution between two necessarily closely spaced solid surfaces. We have prepared flux compositions in a liquid flow type micronising mill having a clearance between the rotor and stator blades of the order of 1 millimeter (1000 micrometers). The rate of settlement of the micronised solid phase was rapid, over 1 millimeter in 20 seconds, but this has proved adequate for use in industrial fluxes with continuous agitation of the flux. A finer grain size would be desirable but not essential.

Measurement of the solid grains in the micronised product is of course difficult as the particle shape is not spherical and some particles are aggregates of smaller grains. The maximum size found from the above milling operation was over 120 micrometers in some cases, the average being approximately 50 micrometers. Finer particles were present the minimum size being about 10 micrometers. The percentage by weight of the larger particles, over 75 micrometers, varied from 80% to 95%. The percentage by number of the larger particles was less than 25% in some cases, and up to 60% in others.

The following examples illustrate the invent invention:

EXAMPLE I

A dispersed flux composition was prepared from the following constituents, the percentages all being expressed by weight:

Tartaric acid—7%
Sarcosine—8%
Water—15%
Isopropyl Alcohol—70%

The solids were dispersed in the liquid mixture in a liquid flow type micronising mill having a clearance between the rotor and stator of 1000 microns. Micronising was conducted for 15 minutes at a rotor speed of 18,000 revs/min.

Copper compnents were tinned using the flux followed by washing and damp heat exposure as specified in BS 2011 tests C and D disclosed no remaining corrosive residue.

EXAMPLE II

A series of dispersed flux compositions were prepared as in Example I from the following constituents:

11-Aminoundecanoic Acid—5-15%
Isopropyl Alcohol—95-85%

As before, a series of tests according to BS 2011 disclosed no corrosive residues within 10 days without any removal of the flux residues.

EXAMPLE III

A dispersed flux composition was prepared as in Example I from the following constituents:

Oleic Acid—10%
Adipic Acid—20%
2,4 Hexadienioc Acid—20%
(Sorbic Acid)—40%
Isopropyl Alcohol—30%

The resulting solid (at room temperature) was an excellent flux for cathodically cleaned mild steel, although removal after soldering required organic solvents. Micronisation in this case permitted adequate dispersion of the flux components in an inadequate volume of solvent. The flux mixture melted at about 50° C. and was thus easily spread over the bond area.

These examples demonstrate the facility of the use of such dispersed flux compositions in soldering processes.

I claim:

1. A flux composition comprising a dispersion of an amount of finely divided particles of a material selected from the group consisting of liquid and solid flux materials, said particles being dispersed, in a form selected from the group consisting of an emulsion and a suspension, in an amount of liquid carrier material in which all of said amount of said flux material is insoluble, wherein said dispersion consists essentially of a mixture of tartaric acid and sarcosine as said flux material and, as said liquid carrier material, a material selected from the group consisting of isopropyl alcohol and a mixture of water and isopropyl alcohol.

2. A flux composition comprising a dispersion of an amount of finely divided particles of a material selected from the group consisting of liquid and solid flux materials, said particles being dispersed, in a form selected from the group consisting of an emulsion and a suspension, in an amount of liquid carrier material in which all of said amount of said flux material is insoluble, wherein said dispersion consists essentially of 11-aminoundecanoic acid as said flux material and, as said liquid carrier material, a material selected from the group consisting of isopropyl alcohol and a mixture of water and isopropyl alcohol.

3. The flux composition recited in claim 1 wherein said liquid carrier material is a mixture of water and isoporpyl alcohol.

4. The flux composition recited in claim 3 comprising about 7 weight % tartaric acid, about 8 weight % sarcosine, about 15 weight % water and about 70 weight % isopropyl alcohol.

5. The flux composition recited in claim 2 wherein said liquid carrier material is isopropyl alcohol.

6. A method of tinning a printed circuit board using the solder flux composition recited in claim 1, 5, 2, the method including forming a dispersion of finely divided flux particles in a liquid in which said flux particles are substantially insoluble, applying said dispersion to a printed circuit board, and applying a molten solder composition to said fluxed board to effect tinning.

7. A method as claimed in claim 6, and wherein the tinned board is subsequently washed in a liquid in which the flux is soluble.

8. A method as claimed in claim 6, and wherein the flux dispersion is applied to the board in an unstable foam.

9. The flux composition recited in claim 5 comprising 5-15 weight % aminoundecanoic acid and 95-85 weight % isopropyl alcohol.

* * * * *